(12) United States Patent
Lee

(10) Patent No.: US 7,049,678 B2
(45) Date of Patent: May 23, 2006

(54) DIVERSE BAND GAP ENERGY LEVEL SEMICONDUCTOR DEVICE

(75) Inventor: Thomas H. Lee, Burlingame, CA (US)

(73) Assignee: Matrix Semicoductor, Inc., Santa Clara, CA (US)

( * ) Notice: Subject to any disclaimer, the term of this patent is extended or adjusted under 35 U.S.C. 154(b) by 387 days.

(21) Appl. No.: 10/254,123

(22) Filed: Sep. 25, 2002

(65) Prior Publication Data

US 2003/0164492 A1 Sep. 4, 2003

Related U.S. Application Data

(62) Division of application No. 10/077,108, filed on Feb. 15, 2002.

(51) Int. Cl.
*H01L 29/00* (2006.01)
(52) U.S. Cl. .................................. 257/530; 365/175
(58) Field of Classification Search ............... 365/148, 365/175, 105; 257/530
See application file for complete search history.

(56) References Cited

U.S. PATENT DOCUMENTS

| | | | |
|---|---|---|---|
| 5,360,986 A | 11/1994 | Candelaria | |
| 5,745,407 A | 4/1998 | Levy et al. | |
| 5,835,396 A | * 11/1998 | Zhang | ........................ 365/51 |
| 6,034,882 A | 3/2000 | Johnson et al. | |
| 6,420,215 B1 | 7/2002 | Knall et al. | |

FOREIGN PATENT DOCUMENTS

JP 10079521 * 3/1998

* cited by examiner

*Primary Examiner*—Hoai Pham
(74) *Attorney, Agent, or Firm*—Matrix Semiconductor, Inc; Pamela J. Squyres (57) ABSTRACT

Hetero-structure semiconductor devices having first and second-type semiconductor junctions are disclosed. The hetero-structures are incorporated into pillar and rail-stack memory circuits improving the forward-to-reverse current ratios thereof.

3 Claims, 4 Drawing Sheets

DIVERSE BAND GAP ENERGY LEVEL SEMICONDUCTOR DEVICE

This is a division of application Ser. No. 10/077,108, filed Feb. 15, 2002.

FIELD OF THE INVENTION

The invention relates generally to electronic devices and, more particularly, to memory semiconductor devices having diverse band gap energy levels providing high forward-to-reverse current ratios.

BACKGROUND OF THE INVENTION

Memory circuits are at the core of any computer system. In this regard, one of the driving forces in memory circuit design has been to place a maximum number of memory cells in as small a physical space as possible. Initially, memory circuit design was constrained by the planar nature (i.e., two-dimensional) of the physical substrates upon which memory cells were fabricated. This constraint has given way to three-dimensional spaces that include the area provided by the physical substrates and the space above and below such substrates. As such, memory circuit designers introduced vertical memory cells resulting in three-dimensional memory arrays.

Vertical memory cells have themselves evolved into various forms. For example, U.S. Pat. No. 6,034,882 to Johnson et al., which is hereby fully incorporated by reference, describes a vertically fabricated memory cell having a steering element for enhancing the flow of current in one direction and a state change element for retaining a programmed state. The steering element functions similar to a diode and conducts more readily in one direction than in the other. In this regard, a current can be forced into the state change element for programming or for sensing the state thereof.

Additionally, U.S. pending application Ser. No. 09/560, 626, and its continuation-in-part, U.S. patent application Ser. No. 09/814,727, both assigned to the assignee of the instant application, and titled "Three-dimensional Memory Array and Method of Manufacture," and which are both hereby also fully incorporated by reference, describe a multi-level memory array having a plurality of rail-stacks forming memory cells. As such, the various material layers of the rail-stacks are configured to perform diode functions by conducting current in one direction more readily than in the other. This function facilitates programming of the memory cells and sensing of the states thereof.

In this regard, the diode functions accomplished by the above-described memory designs are typically performed by two layers of a single semiconductor material such as, for example, silicon (Si)—but with each layer having an opposite conductivity dopant (e.g., n-type silicon and p-type silicon). Such structures have been commonly referred to a homo-structures or homo-junctions because a single semiconductor material is used. In terms of ease of fabrication, relying on a single semiconductor material such as Si, SiGe, GaAs, or InP, for accomplishing the diode functions is advantageous. However, relying on a single semiconductor material for these functions also places certain constraints on the achievable device performance. For example, physical dimensions and doping concentrations can be varied to increase device performance, but only to a limit before other device characteristics begin to decrease or fail.

Hence, materials and methods for allowing higher achievable device performance such as, for example, the diode function of memory cells, is highly desirable.

SUMMARY OF THE INVENTION

The present invention employs hetero-structures, or hetero-junctions, having a plurality of band gap energy levels for increasing the forward-to-reverse current ratios of PN junctions. As used herein, the terms "hetero-structure" or "hetero-junction" mean a structure having at least first-type and second-type semiconductor materials either in contact with each other to form a junction or separated by an insulator. A PN junction is a junction between opposite polarity-type (i.e., P-type and N-type) doped semiconductor materials. As such, a PN junction can be realized as a hetero-junction.

In this regard, one embodiment of the present invention is directed to a semiconductor device comprising a first semiconductor layer having a first band gap energy level, a second semiconductor layer having a second band gap energy level, and an insulating layer disposed between the first and second layers that is capable of being selectively breached by passing a current between one of the first and second semiconductor layers. The second band gap energy level is different from the first band gap energy level. As will be described in more detail below, a band gap energy level is different from one or more other band gap energy levels when it is not the same or not equal to the other band gap energy level(s). This includes a particular band gap energy level being greater or less than one or more other band gap energy levels. So formed, the wide band gap energy level differences provide a higher ratio of forward-to-reverse current between the first and second semiconductor layers when such layers form a PN junction.

Therefore, it is an advantage of the present invention to provide a hetero-structure for use in memory devices.

It is yet another advantage of the present invention to provide a hetero-structure having a wide band gap energy level difference for increasing the forward-to-reverse current ratio of diode functions of memory devices.

It is still further an advantage of the present invention to provide a hetero-structure that utilizes existing semiconductor fabrication technology.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

DETAILED DESCRIPTION OF ILLUSTRATED EMBODIMENT

The present invention provides a hetero-structure, or hetero-junction, suitable for use in diode-based memory circuits. In this regard, the hetero-structures of the present invention provide a higher ratio of forward-to-reverse current compared to homo-structures, or homo-junctions, because a larger energy gap for reverse-flow is achievable between two different semiconductor materials compared to a homo-junction of two layers of a single semiconductor material.

More generally, each semiconductor material has its own characteristic band gap energy. In a homo-junction structure such as a diode, the asymmetrical conduction characteristics of the diode are entirely a function of doping levels between the junction. In a hetero-structure junction, there is an additional degree of freedom provided by the difference in band gap energies between the different junction materials. Thus, even between two n-doped regions of hetero-junction, there can be asymmetrical conduction if these regions are made from different semiconductors. A hetero-junction can exhibit a different barrier to forward electron flow than to reverse hole flow—aside from that provided by the doping of the semiconductor materials.

As will be presently described, the hetero-structures of the present invention are incorporated into two types of memory structures: pillar memory structures and rail-stack memory structures.

Figure 1:
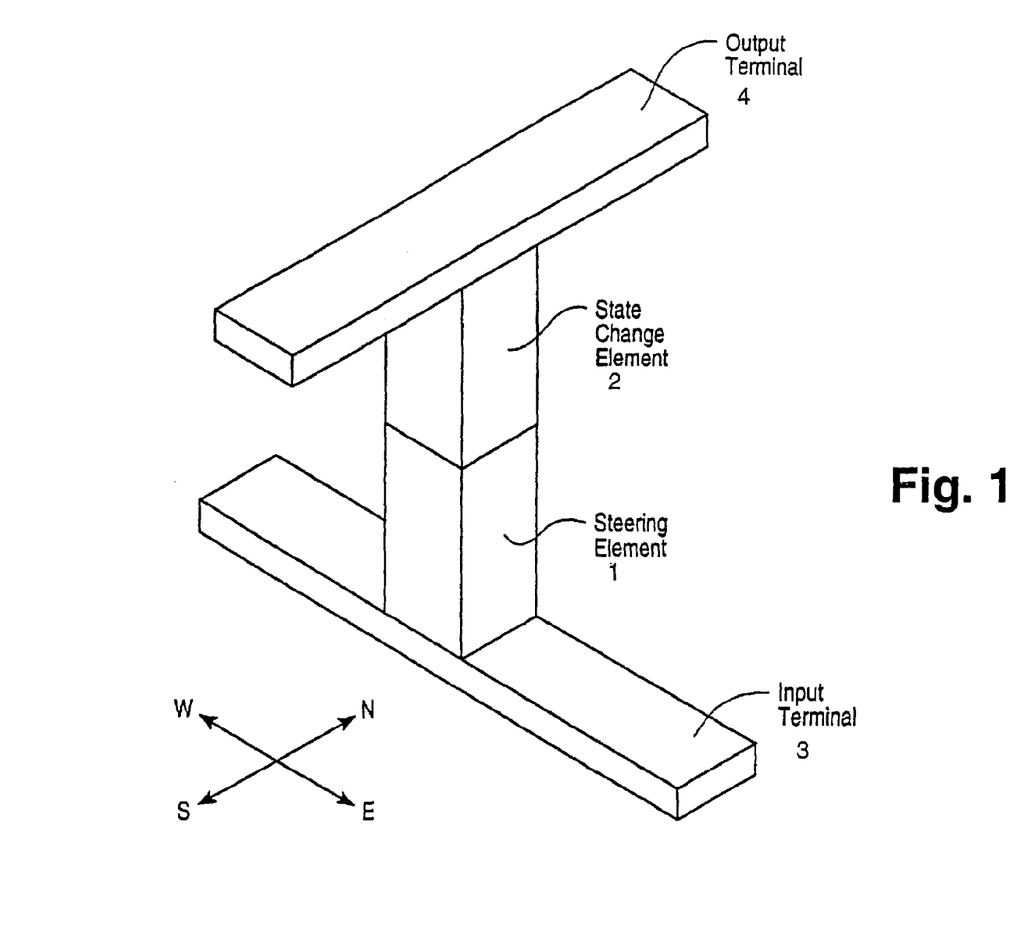
FIG. 1 illustrates a first embodiment of the present invention forming a pillar memory element.

In this regard, FIG. 1 is a perspective view of a pillar memory cell incorporating the hetero-structures of the present invention. The pillar memory cell and its various implementations are described in detail in U.S. Pat. No. 6,034,882 to Johnson et al. (hereinafter the '882 patent), which has been fully incorporated by reference above. As such, the pillar memory cell has two explicit terminals: an input terminal 3 (also known as a "wordline") and an output terminal 4 (also known as a "bitline.") Between these terminals, the memory cell contains a steering element 1 and a state change element 2 connected in series. Neither the input terminal 3, nor the output terminal 4, nor the steering element 1, nor the state change element 2 is built in a planar semiconductor substrate.

The steering element 1 is a device with a strongly asymmetric current-versus-voltage characteristic; it conducts more readily in one direction than in the other. The purpose of the steering element 1 is to ensure that current flow through the memory cell is substantially unidirectional. This unidirectional behavior enables the memory decoders to establish a unique circuit path to each individual memory cell, allowing it to be individually accessed (for reads and for writes) regardless of the state of all other cells. As will be described in connection with FIGS. 2 and 3, the hetero-structures of the present invention are incorporated into the steering element 1.

The state change element 2 is a device which can be placed in more than one state, and whose state is not lost or altered when electrical power is removed. One possible implementation among the many discussed below, is a dielectric-rupture antifuse, having the states (high impedance) and (low impedance.) These two stored states accomplish the encoding of one bit of memory.

As shown in FIG. 1, the steering element 1 and the state change element 2 are stacked vertically in a "pillar" shaped arrangement having a generally rectangular cross-section. The pillar is vertical and so is the current flow. Depending on the orientation of the unidirectional steering element 1, current can flow either upwards or downwards with respect to, for example, an underlying substrate. In fact, in one embodiment, current flows upwards in some layers of a vertical stack of cells, and downwards in the other layers. This aspect of the present invention is more fully described in the incorporated by reference '882 patent.

The state change element 2 is chosen so that it can be switched from its initial state to another state by electrical means, thereby making the memory field programmable. For example, the state of a dielectric-rupture antifuse may be changed electrically by applying a relatively large voltage (when compared to the voltage used for reading) across the input and output terminals 3 and 4, respectively, of the memory cell.

Figure 2:
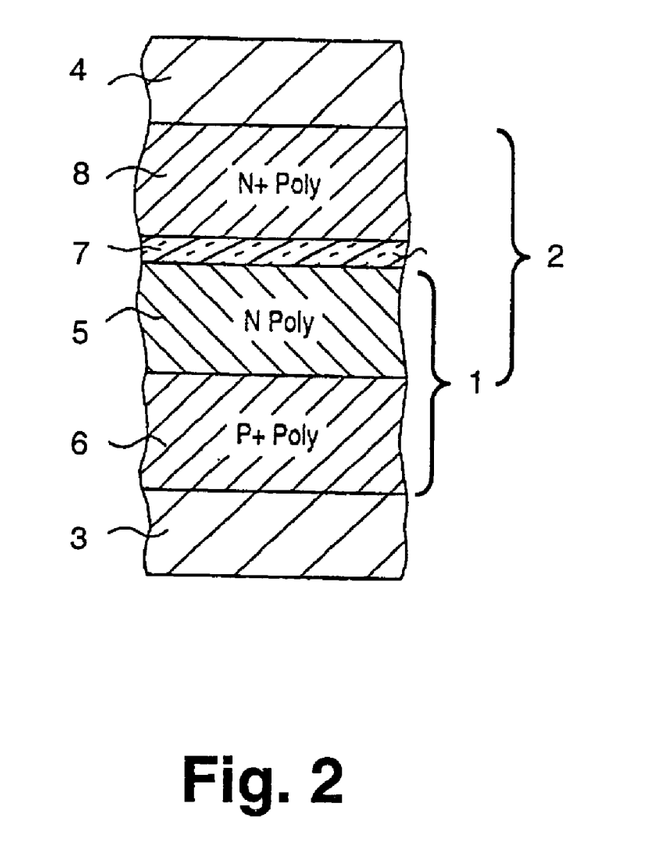
FIG. 2 is a partial cross-section of the first embodiment shown in FIG. 1.

Referring now to FIG. 2, one embodiment of the present invention is illustrated with the steering element 1 in the form of a hetero-structure polycrystalline PN junction diode and the state change element 2 in the form of poly-oxide-poly dielectric rupture antifuse. In this embodiment, a pillar contains four layers of material in a layer stack, deposited sequentially as shown: (1) a P+ doped first-type polycrystalline semiconductor layer 6; (2) an N− doped second-type polycrystalline semiconductor layer 5; (3) a layer of silicon dioxide 7; (4) an N+ doped second-type polycrystalline semiconductor layer 8. Semiconductor layers 6 and 5 form a PN junction diode (the steering element 1), and layers 5, 7, and 8 form a dielectric rupture antifuse (state change element 2.) Lastly, the pillar memory cell has conductors 3 and 4 below layer 6 and above layer 8.

The N-type doped layers 5 and 8 are selected from a first-type polycrystalline semiconductor material and P-type doped layer 6 is selected from a second-type polycrystalline semiconductor material. In this regard, the first-type and second-type polycrystalline semiconductor materials are selected so as to provide between the two materials a large energy level difference for reverse-current flow compared to forward-current flow. This provides a larger forward-to-reverse current ratio for the junction. Examples of suitable first-type and second-type polycrystalline semiconductor materials are shown in Table 1, along with each material's band gap energy level:

TABLE 1

| P-type doped semiconductor materials: | Corresponding N-type doped semiconductor materials: |
|---|---|
| Si (1.11 eV) | SiC (2.86 ev) |
| SiGe (0.72–1.10 eV) | Si (1.11 eV) |
| SiGe (0.72–1.12 eV) | SiC (2.86 eV) |
| Si (1.11 eV) | GaAs (1.43 eV) |
| Si (1.11 eV) | InP (1.35 eV) |
| InP (1.35 eV) | GaAs (1.43 eV) |

Hence, according to Table 1, the N-type semiconductor layers 5 and 8 of FIG. 2 can be made from silicon carbide (SiC) and the P-type semiconductor layer 6 can be made from silicon (Si). Similarly, the N-type semiconductor layers 9 and 12 of FIG. 3 can be made from SiC and the P-type semiconductor layer 10 can be made from Si. Likewise, the remaining combinations shown in Table 1 can also be used. The most preferred combination of materials is N-type Si and P-type SiGe.

It should be noted that Table 1 is merely representative of many material combinations suitable for the present invention. More generally, Table 1 can be expanded to include any combination of a first semiconductor material having a first band gap energy level and a second semiconductor layer having a second band gap energy level, wherein the second band gap energy level is greater than the first band gap energy level. These semiconductor materials can include ternary and quaternary semiconductor materials such as GaAsP and InAsP, and GaAsInP, respectively. The magnitude of the difference between the first and second band gap energy levels is greater than 0.05 eV and, preferably, greater than 0.08 eV. Most preferably, the magnitude of the band gap energy level difference between the first and second semiconductor materials is greater than 0.1 eV. The larger the magnitude of the band gap energy level difference, the larger the magnitude of the forward-to-reverse current ratio for the hetero-junction. Table 2 further describes suitable elements, compounds, and materials.

TABLE 2

| Material System | Element or Compound | Name | Band Gap (ev) at 300° K. |
|---|---|---|---|
| IV | C | Carbon (diamond) | 5.47 |
| | Ge | Germanium | 0.66 |
| | Si | Silicon | 1.11 |
| | Sn | Grey Tin | 0.00 |
| IV-IV | SiC | Silicon carbide | 2.86 |
| III-V | AlAs | Aluminum arsenide | 2.16 |
| | AlP | Aluminum phosphide | 2.45 |
| | AlSb | Aluminum antimonide | 1.58 |
| | BN | Boron nitride | ~7.5 |
| | BP | Boron phosphide | 2.0 |
| | GaAs | Gallium arsenide | 1.43 |
| | GaN | Gallium nitride | 3.36 |
| | GaP | Gallium phosphide | 2.26 |
| | GaSb | Gallium antimonide | 0.72 |
| | InAs | Indium arsenide | 0.36 |
| | InP | Indium phosphide | 1.35 |
| | InSb | Indium antimonide | 0.17 |
| II-VI | CdS | Cadmium sulfide | 2.42 |
| | CdS | Cadmium sulfide | 2.42 |
| | CdSe | Cadmium selenide | 1.70 |
| | CdTe | Cadmium telluride | 1.56 |
| | ZnO | Zinc oxide | 3.35 |
| | ZnS | Zinc sulfide | 3.68 |
| | ZnS | Zinc sulfide | 3.68 |
| | ZnSe | Zinc selenide | 2.71 |
| | ZnTe | Zinc telluride | 2.39 |
| | HgSe | Mercury selenide | ~0.7 |
| | HgTe | Mercury telluride | ~0.45 |
| IV-VI | PbS | Lead sulfide | 0.41 |
| | PbSe | Lead selenide | 0.27 |
| | PbTe | Lead telluride | 0.31 |

Figure 3:
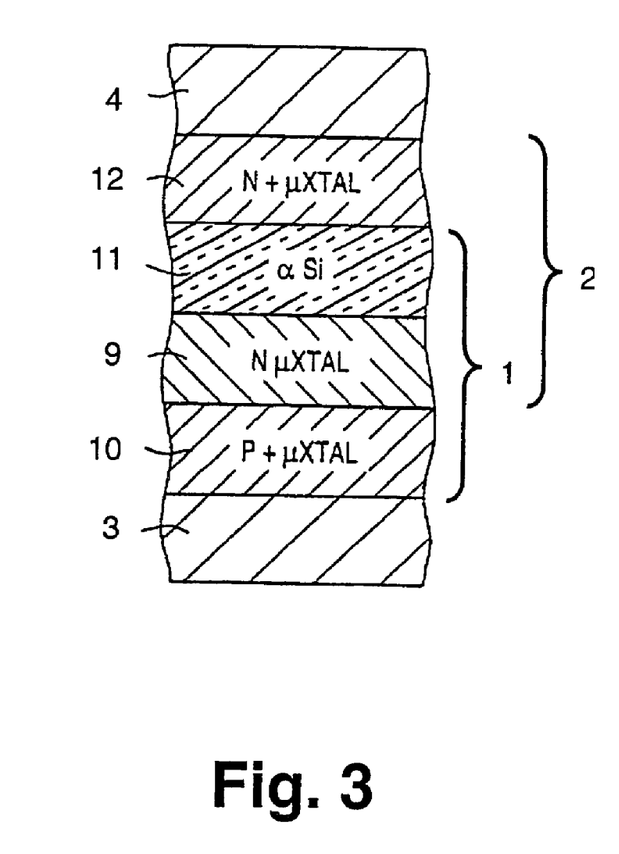
FIG. 3 is an alternate partial cross-section of the first embodiment shown in FIG. 1.

An alternate pillar structure is shown in FIG. 3. Again it includes conductors 3 and 4, which can be fabricated from any conductive material such as metal, metal silicide, or heavily doped polysilicon. The steering element 1 in the stack comprises a layer 10 of P+ doped first-type microcrystalline semiconductor material, and a second layer 9 of N doped second-type microcrystalline semiconductor. In this regard, Table 1 also illustrates suitable first-type and second-type semiconductor materials, but in microcrystalline form, for N type layers 9 and 12, and P type layer 10.

The state change element 2 comprises layer 11. Layer 11 can be an amorphous silicon layer used to form an antifuse. This layer has a nominal high resistance; however, after a large current is passed through it for programming, its resistance will be substantially lower. The layer 12 is shown as an N+ layer to provide good electrical contact to the overlying conductor 4. Layer 12 can be amorphous, microcrystalline or polysilicon.

Formed as such, the pillar memory cell having steering element 1 and state change element 2 can be incorporated into various memory array structures, as disclosed in the incorporated by reference '882 Patent. Additionally, the pillar memory cell of the present invention can be fabricated according to the methods disclosed in the incorporated by reference '882 Patent and conventional semiconductor fabrication processes.

Figure 4:
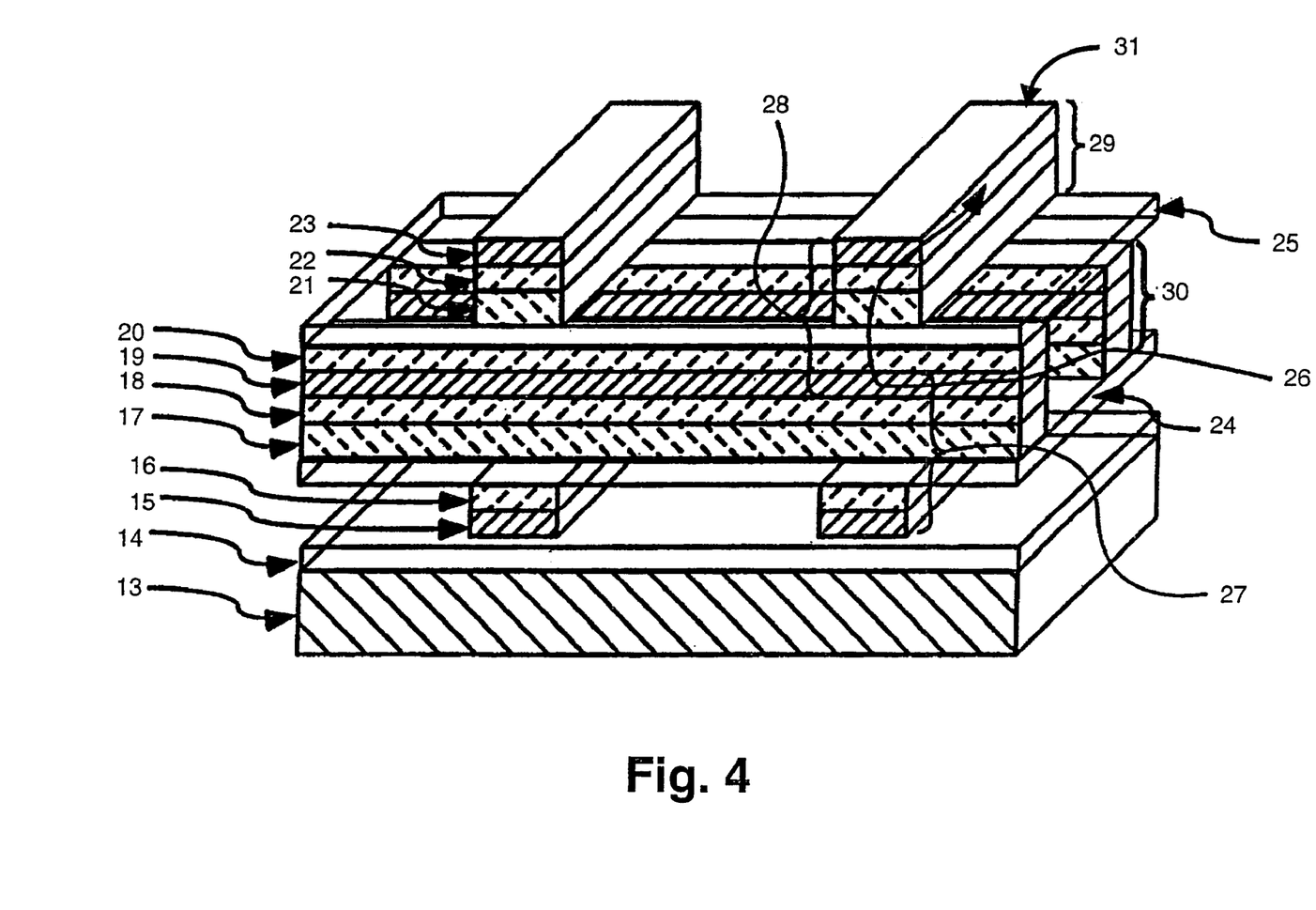
FIG. 4 illustrates a second embodiment of the present invention forming a rail-stack memory structure.

FIG. 4 illustrates the hetero-structures of the present invention incorporated into a rail-stack memory embodiment. The use of rail-stacks departs from prior three-dimensional memories where conductors alone were used in lieu of rail-stacks and where discrete cells (e.g., pillars) were formed at the intersections of the conductors. The construction and fabrication of rail-stack vertical memory cells and arrays are further described in pending U.S. patent application Ser. No. 09/560,626 (hereinafter '626 application) and its continuation-in-part U.S. patent application Ser. No. 09/814,724, which have been fully incorporated by reference above.

In this regard, a bit is stored at each of the intersections of the rail-stacks. However, there is no apparent individual memory cell at the intersections, rather memory cells are defined by the rail-stacks and intermediate layers. This makes it easier to fabricate the invented array, as described in the incorporated by reference applications. When the array is fabricated, all the bits are in the zero (or one) state and after programming, the programmed bits are in the one (or zero) state.

In the embodiment FIG. 4, several rail-stacks are illustrated in the partial cross-section of the invented array. For instance, rail-stack 30 is shown at one height and a half rail-stack 29 is shown at a second height above the first height. Also, half rail-stacks are disposed between rail-stack 30 and a substrate 13. These lower rail-stacks run in the same direction as the half rail-stack 29. A bit is stored at the intersection of rail-stacks and, for instance, a "cell" is present between the rail-stacks and layers shown within the bracket 28 and another within the bracket 27. Each of these brackets span a memory level.

The array is fabricated on a substrate 13, which may be an ordinary monocrystaline silicon substrate. Decoding circuitry, sensing circuits, and programming circuits are fabricated in one embodiment within the substrate 10 under, the memory array using, for instance, ordinary MOS fabrication techniques. These circuits may also be fabricated above the substrate. Vias are used to connect conductors within the rail-stacks to the substrate to allow access to each rail-stack in order to program data into the array and to read data from the array. For instance, the circuitry within the substrate 13 may select rail-stack 30 and the rail-stack 29 in order to either program or read a bit associated with the intersection of these rail-stacks.

As shown in FIG. 4, an insulating layer 14 is formed over the substrate 13 in order that the array may be fabricated above the substrate 13. This layer may be planarized with, for instance, chemical-mechanical polishing (CMP) to provide a flat surface upon which the array may be fabricated.

Following this, a conductive layer 15 is formed on the substrate. As will be seen, conductive layers are used within the rail-stacks and these layers and the resultant conductors may be fabricated from elemental metals such as tungsten, tantalum, aluminum, copper or metal alloys may be used such as MoW. Metal silicides may also be used such as $TiSi_2$, $CoSi_2$ or a conductive compound such as TiN, or WC may be used. A highly doped semiconductor layer such as silicon is also suitable. Multiple layer structures may be used selecting one or more of the above.

Following the deposition of conductive layer 15, a layer 16 of a first type of semiconductor material is formed over the conductive layer 15. This is typically a polysilicon layer; however, a microcrystalline or amorphous layer can also be used. In the embodiment of FIG. 4, this semiconductor layer 16 is highly doped and, as will be seen, forms one-half a diode. After masking and etching steps, the lower half rail-stacks are formed. These rail-stacks are "half" or partial rail-stacks since they are approximately half the thickness of the rail-stacks used in the next level.

Following this, in the embodiment of FIG. 4, a material for the antifuses used to program the array is deposited. In one embodiment, layer 24 is a dielectric such as silicon dioxide, which is deposited by chemical vapor deposition (CVD) in a blanket deposition over the half rail-stacks and a dielectric fill, filling the space between the rail-stacks. In another embodiment, layer 24 is grown on the upper surface of the layer 16 and only exists on the rail-stacks.

Next, a full set of memory array rail-stacks is formed on the dielectric layer 24. This comprises first the deposition of a lightly doped second-type of semiconductor layer 17 doped with a conductivity type dopant opposite to that used for first-type semiconductor layer 16, a heavily doped second-type semiconductor layer 18 doped also opposite to the layer 16, a conductive layer 19 and a heavily doped second-type semiconductor layer 20 doped with the same conductivity type dopant as layers 17 and 18. After masking and etching, the rail-stacks shown in FIG. 4, such as rail-stack 30 are formed. These rail-stacks are, as illustrated, in a direction perpendicular to the rail-stacks above and below them.

While not shown in FIG. 4, the spaces between the rail-stacks after they are defined are filled with a dielectric such as silicon dioxide. Then, the rail-stacks and fill are planarized by CMP. In another embodiment, spin-on-glass (SOG) is used to, fill the voids. In this case, chemical planarization can be used such as, for example, plasma etching. Other conventional fill and planarization methods can also be used.

After formation of the rail-stacks another antifuse layer 25 is formed, for instance, from a dielectric such as silicon dioxide, silicon nitride, silicon oxynitride, amorphous carbon or other insulating materials or combinations of materials. Also an undoped layer of silicon may be used for the antifuse layer.

Now another layer of rail-stacks are defined; only half rail-stacks are shown in FIG. 4 at this upper level. This half rail-stack comprises a layer 21 of the first-type semiconductor doped with a conductivity type dopant opposite to that of layer 20. This is a lightly doped layer. Another layer 22 of the first-type semiconductor is formed on layer 21 and this layer is doped with the same conductivity type dopant as layer 21; however, it is more heavily doped. Then a conductive layer 23 is formed above the layer 22.

Doped semiconductor layers 16, 21, and 22 are made of a first-type semiconductor material and doped semiconductor layers 17, 18, and 20 are of a second-type semiconductor material. In this regard, the present invention provides for a given rail-stack to be comprised of a first-type semiconductor material, while its vertically adjoining rail-stacks are comprised of a second-type semiconductor material. As such, the rail-stacks alternate between first-type and second-type semiconductor materials throughout the memory array to provide a hetero-structure diode function between adjoining rail-stacks. Table 1 once again illustrates the suitable combinations of semiconductor materials for the rail-stacks in amorphous, polycrystalline, microcrystalline, and crystalline form.

For example, the layers of rail-stack 30, which are of a first-type semiconductor material, can be made from N-type silicon carbide (SiC) and the layers of rail-stack 29, which are of a second-type semiconductor material, can be made from P-type silicon (Si). In this manner, vertically adjoining rail-stacks would alternate in composition between N-type SiC and P-type Si semiconductor materials. Similarly, the semiconductor layers of rail-stack 30 can be made of N-type silicon (Si) and the layers of rail stack 29 can be made of P-type silicon germanium (SiGe). According to this combination, vertically adjoining rail-stacks would alternate in composition between N-type Si and P-type SiGe semiconductor materials. Likewise, the remaining combinations of materials in Table 1 can also be used.

As described above, half rail-stacks are preferably used at the very upper-most level of the array and at the very lowest level of the array. In between the half rail-stacks, the full rail-stacks, such as rail-stack 16, are preferably used throughout the array.

It should be noted that in the preferred embodiment described, the semiconductor layers disposed on the conductive layers extend the entire length of the rail-stacks in the embodiment of FIG. 4 and are uninterrupted except possibly where vias are used to provide a conductive path to the substrate 13.

In FIG. 4, a path 26 is illustrated from a lower conductor layer 19 in cell 28 to an upper conductor layer 31 found in the rail-stack 29. This path is accessed in one embodiment through decoding circuitry in the substrate for both programming and reading of data into and from the array for one bit.

For instance, to program the bit, a relatively high voltage, 5–20V, is applied between the conductors (e.g., conductors 19 and 23) generally so as to forward-bias the "diode" between these conductors. This relatively high voltage causes a breach in the layer 25 creating a diode. Without this high voltage, the layer 25 remains an insulator. Thus, by selecting pairs of conductors, diodes can be selectively formed so as to program the array. Given the hetero-structures of the present invention, these diodes have higher forward-to-reverse current ratios than homo-structure or homo-junction diodes of a single semiconductor material. While programming the array with the layers adjacent to the antifuse material being forward-biased is currently preferred, it is also possible to program using a reverse-biasing potential.

To sense the data programmed into the array, a voltage lower than that for programming is used. This voltage is applied so as to forward-bias the diode of the cell being accessed and thus allowing a sense amplifier to determine whether or not the layer 25 is intact between the rail-stacks.

Note that "sneak" or parasitic paths in the array which would interfere with the sensing will include a reverse-biased diode.

In the illustrated embodiment, the "anode" and "cathode" of the diodes are reversed at each of the successive antifuse layers. This facilitates easier programming and sensing since all of its conductors at each level are either bit lines or word lines. And, for, instance, conductors at one height can serve as bit lines for two levels and conductors at the next height can serve as word lines for two levels. This simplifies the decoding and sensing and more importantly reduces processing.

Figure 5:
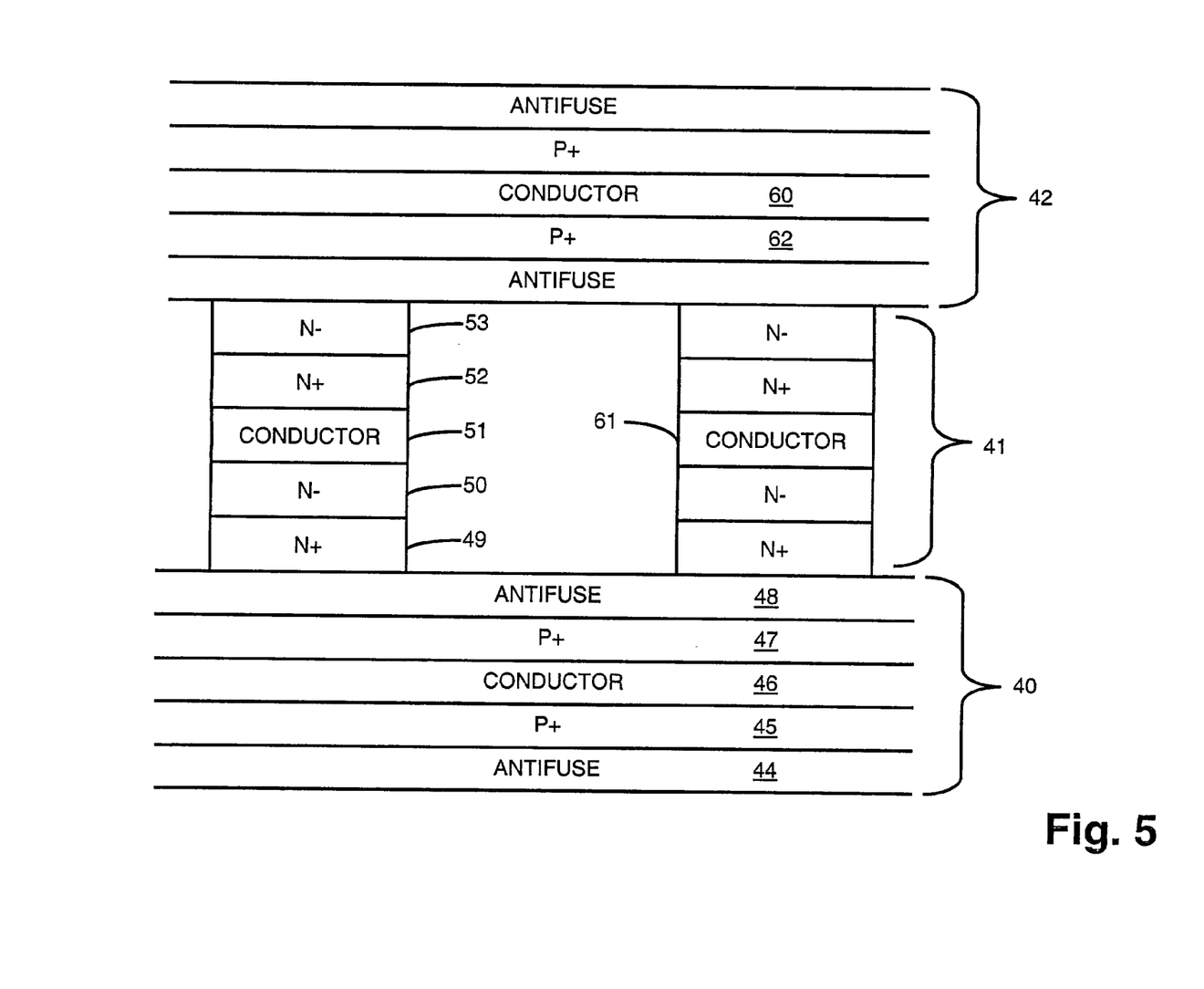
FIG. 5 illustrates a third embodiment of the present invention forming a second embodiment of a rail-stack memory structure.

Some of the embodiments discussed above use both p−n+ and p+n− diode types. In some processes, one of these diode types may exhibit more leakage than the other. Consequently, it may be desirable to have, for these processes, an array with only a single diode type. More specifically, assume a process has higher leakage for diodes which are p−n+ type than the same process has for diodes of the p+n− type. FIG. 5 illustrates an array embodiment where, if the antifuse layer is breached, all the diodes will be p+n− type, that is, there will be no diodes with a p−n+ junction.

In FIG. 5, three rail-stacks 40, 41, and 42 are illustrated which will create only a single type diode specifically, p+n−. The first rail-stack 40 comprises: an anti-fuse layer 44 of approximately 30 Å thick; a p+ semiconductor layer 45 of, for instance, 1,000 Å thick; a conductor 46 of, for example, 500 Å thick; a p+ layer 47 of, for example, 1,000 Å thick; and an anti-fuse layer 48 of approximately 30 Å thick. These layers may be formed as discussed above. Rail-stack 41 comprises: an n− semiconductor layer 49 of, for instance, 2,000 Å thick; an n+ semiconductor layer 50 of, for example, 500 Å thick; a conductor 51 of, for instance, 500 Å thick; an n+ semiconductor layer 52 of, for instance, 500 Å thick; and an n− semiconductor layer 53 of, for example, 2,000 Å thick. The rail-stack 42 has the same layering as the rail-stack 40. The rail-stack formed on top of rail-stack 42 (not shown) or below rail-stack 40 (not shown) is identically constructed as rail-stack 41. Hence, in one embodiment, the repeating rail-stack structure corresponds to a vertically repeating pattern of rail-stacks that include, for example, rail-stack 40, on top of which is formed a rail-stack similar in construction to rail-stack 41, on top of which is formed a rail-stack similar in construction to rail stack 40, and so on. Note that the formation can extend either vertically upward or downward.

As discussed above, the semiconductor layers are preferably made of two different semiconductor materials having different band gap energy levels such as, for example, those described in Table 1 and its accompanying text. The conductors may be a highly doped silicon or a metal, metal alloy, silicide or combinations thereof. The dielectric fill in the spaces between the rail-stacks is also used as discussed for the earlier embodiments.

As can be seen from FIG. 5, if the antifuse layers are breached, the diodes between the conductors 46 and 51 are all p+n− type, and similarly, the diodes in the next level between the conductors 51 and 60 are again all p+n− type. The rail-stacks shown are used throughout the memory array so that the entire array has only p+n− type diodes in its memory cells.

The diodes in the illustrated rail-stacks of FIG. 5 are forward biased towards the conductor 51 and the conductor 61. If need be for a particular application, the diodes can be oriented identically, that is, with all their anodes (or cathodes) pointing upwardly. This can be obtained for the p+n− type diodes by having both a p+ doped and n− doped semiconductor layer in each of the rail-stacks. For instance, layer 52 and 53 would be replaced with a p+ layer and layer 62 would be replaced with n− and n+ layers. This still maintains only one type of diode (p+n−) throughout the array.

While FIG. 5 shows that after the antifuse is breached only p+n diodes are created, an array with only p−n+ type diodes can be fabricated by replacing the p+ layers with an n+ layer and replacing the n+ and n− layers with p+ and p− layers. Also, the array can have the anodes (or cathodes) vertically aligned as discussed above for the p+n− type diodes.

It should be noted that for the embodiment of FIG. 5, planarization occurs on an n− layer, for example, the n− layer 53 is planarized before the formation of the anti-fuse layer. For this reason, layer 53 is somewhat thicker. More care is required in the polishing of the n− layer 53 to assure uniformity across the wafer and the resultant uniform diode characteristics. In this connection, a "hard" mask may be used such as described in co-pending application Ser. No. 09/746,469, filed by N. Johan Knall and James M. Cleeves, and titled "Methods Of Forming Nonvolatile Memory Devices Utilizing A Hard Mask" assigned to the assignee of the present application and hereby fully incorporated by reference. One result of having thicker n− layers is that the rail-stack 41 is thicker than the rail-stacks 40 and 42.

Formed as such, the hetero-structure rail-stacks of the present invention can be incorporated into the memory structures and fabricated according to the methods described in incorporated by reference applications.

As described in Table 1 above and its accompanying text, the present invention is applicable to a wide range of semiconductor materials for forming the hetero-structures and memories described herein. In this regard, the issue of matching lattice spacing between the different semiconductor materials is much relaxed compared conventional hetero-structure fabrication. The inability to provide such matching has limited the utility of hetero-structures to all but a few combination of materials. However, since the present invention only forms a hetero-junction or diode upon breaching an antifuse layer, the filament formed is very small—sometimes measuring only dozens of atoms across the junction. This means that a 1% or so lattice mismatch is not a problem if fewer than 100 atoms form the filament, as is the case for the present invention. Hence, the present invention provides for the selection of a much wider range of semiconductor materials forming the hetero-structure than would otherwise be possible.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. For example, doping concentrations and dopants can be varied without significantly affecting the band gap energy levels of the hetero-structures. Therefore, the invention, in its broader aspects, is not limited to the specific details, the representative apparatus, and illustrative examples shown and described. Accordingly, departures can be made from such details without departing from the spirit or scope of the applicant's general inventive concept.

I claim:

1. A semiconductor structure comprising:
   a first semiconductor having a first band gap energy level;
   a second semiconductor in electrical communication with the first semiconductor and having a second band gap energy level, wherein the second band gap energy level is different from the first band gap energy level;
   a wordline input in electrical communication with the first semiconductor; and
   a bitline output in electrical communication with the second semiconductor.

2. The semiconductor structure of claim 1 further comprising an insulator layer disposed intermediate the first and second semiconductors.

3. The semiconductor structure of claim 2 wherein the insulator layer is capable of being selectively breached by passing a current between one of the first and second semiconductor layers to form a memory state.

* * * * *